(12) United States Patent
Sahbari

(10) Patent No.: US 6,261,735 B1
(45) Date of Patent: Jul. 17, 2001

(54) COMPOSITION AND METHOD FOR REMOVING PROBING INK AND NEGATIVE PHOTORESIST FROM SILICON WAFERS ENCLOSURES

(75) Inventor: Javad J. Sahbari, Sunnyvale, CA (US)

(73) Assignee: Silicon Valley Chemlabs, Inc., Sunnyvale, CA (US)

( * ) Notice: Subject to any disclaimer, the term of this patent is extended or adjusted under 35 U.S.C. 154(b) by 0 days.

(21) Appl. No.: 09/199,401

(22) Filed: Nov. 24, 1998

(51) Int. Cl.$^7$ ................ B08B 3/08; G03C 11/12
(52) U.S. Cl. ............. 430/256; 134/42; 510/174; 510/176; 216/95
(58) Field of Search .................. 134/42; 216/95; 252/79.1; 510/174, 176; 430/256

(56) References Cited

U.S. PATENT DOCUMENTS

| 4,165,294 | 8/1979 | Vander Mey | 252/143 |
| 4,992,108 | 2/1991 | Ward et al. | 134/38 |
| 5,612,303 | * 3/1997 | Takayanagi et al. | 510/174 |

FOREIGN PATENT DOCUMENTS

| 1-114846 | * 5/1989 | (JP) | G03C/11/00 |

* cited by examiner

Primary Examiner—Randy Gulakowski
Assistant Examiner—Allan Olsen
(74) Attorney, Agent, or Firm—Pillsbury Winthrop LLP; David H. Jaffer

(57) ABSTRACT

A composition and method for removing probing ink and negative photoresist from a substrate with reduced metal corrosion, low toxicity and rapid removal rates. The composition includes a mixture of anisole, an alkylarylsulfonic acid, and aliphatic hydrocarbons containing 9 to 13 carbon atoms.

4 Claims, No Drawings

COMPOSITION AND METHOD FOR REMOVING PROBING INK AND NEGATIVE PHOTORESIST FROM SILICON WAFERS ENCLOSURES

BACKGROUND OF THE INVENTION

1. Field of the Invention

This invention is directed to a composition and method for removal of probing ink and negative photoresist polymer residue from a substrate, such as a silicon wafer. Mixtures including anisole, organic sulfonic acids, and aliphatic hydrocarbons containing 9 to 13 carbon atoms are used to strip hard to remove materials such as probing ink and cross-linked negative photoresist polymer residue. The composition and method achieve improved removal of these materials while significantly reducing metal corrosion.

2. Brief Description of the Prior Art

In the manufacture of semiconductor microcircuits it is necessary to mark defective microchips during the final electrical testing with an epoxy or polyurethane based ink on the finished silicon wafer to distinguish bad dies from the good dies. After the electrical test is done, sometimes it may be deemed necessary to clean the ink off the silicon wafer because of a wrong electrical test program, because bonding pads were misprobed, or for other reasons. This allows the silicon wafer be retested or reprobed with the necessary corrections. Conventional solvents such as alcohols, ketones and esters, or more aggressive heterocyclic solvents such as n-methyl pyrrolidone do not remove hard baked and cured epoxy type probing ink even at elevated temperatures and long process times.

Highly acidic or alkaline solutions and strong oxidizing agents on the other hand, such as fuming nitric acid, sulfuric acid/hydrogen peroxide, and tetramethyl ammonium hydroxide or other alkaline solutions may be effective in removing the ink, but they create corrosion difficulties and stain or destroy the sensitive alloys such as Al/Cu/Si in bonding pad areas of the wafer.

It is therefore highly desirable to provide an environmentally friendly ink removing process and a corresponding composition which in a reasonably short process time cleans only the cured probing ink without leaving any residue, and that is also safe to use on sensitive metal layers.

The present invention is also useful for removal of negative photoresist. Prior art resist removers are described in U.S. Pat. Nos. 4,165,294 and 4,992,108. These patents also describe organic sulfonic acids suitable for use in the present invention, and to that extent their disclosures are incorporated herein by reference.

SUMMARY OF THE INVENTION

It is an object of the present invention to provide a composition and method for removing probing ink and cross-linked negative photoresist polymer residue which is low in toxicity and nonhazardous to the user and the environment.

Another object of this invention is to provide a composition that works more quickly than conventional commercially available strippers or solvent for probing ink and negative photoresist removal.

A further object of this invention is to provide a composition for probing ink and negative photoresist removal which is not corrosive to sensitive alloys and does not adversely effect the sensitive bonding pad areas of a semiconductor wafer.

Briefly, the preferred embodiment of the present invention utilizes a mixture of anisole (methoxybenzene, $C_6H_5$—O—$CH_3$), an alkylarylsulfonic acid, and aliphatic hydrocarbons containing 9 to 13 carbon atoms to remove probing ink and negative photoresist from a substrate with reduced metal corrosion.

DESCRIPTION OF THE PREFERRED EMBODIMENT

This invention provides a composition and method for removing probing ink and cross-linked negative photoresist polymer residue from semiconductor wafers, while reducing corrosive action of the composition on sensitive metal layers. The stripping composition is comprised of from 60% to 85% by weight anisole and from 15% to 40% by weight of an alkylarylsulfonic acid. The composition is preferably free of toxic materials such as phenols and chlorinated hydrocarbons.

An aliphatic hydrocarbon may be added to the composition, with a preferred composition comprising from 25% to 60% by weight anisole, 20% to 60% by weight alkylaryl sulfonic acid having 12–20 carbons, and 20% to 40% by weight aliphatic hydrocarbons containing from 9 to 13 carbon atoms. While the composition with just anisole and the sulfonic acid is the most effective for ink and photoresist removal, the addition of the hydrocarbon component reduces volatility of the composition and results in a longer bath life while still providing effective removal.

Table 1 sets out the compositions used for tests described below.

TABLE 1

| | Composition (by weight) |
|---|---|
| A | 50% anisole, 50% DDBSA |
| B | 30% anisole, 35% DDBSA, 35% hydrocarbon |
| C | 37.5% anisole, 25% DDBSA, 37.5% hydrocarbon |
| D | EKC-712-D Burmar |
| E | EKC-922 Nophenol |

Notes for Table 1: DDBSA is dodecylbenzene sulfonic acid ($C_{12}H_{23}$—$C_6H_4$—$SO_3H$). The hydrocarbons used in compositions A, B, and C was Mineral Spirits Odorless from Ashland Chemical, Shell Sol 71 manufactured by Shell Oil Co., or Mineral Spirits 14D from Van Water & Rogers, Inc. These hydrocarbons are predominantly $C_9$ to $C_{12}$ aliphatic hydrocarbons. Composition D is a commercially available product of EKC Technologies, Inc., a mixture of trichlorobenzene, phenol, $C_9$ to $C_{12}$ aliphatic and aromatic hydrocarbons, and DDBSA. Composition E is also a product of EKC, and is composed of $C_9$ to $C_{12}$ aliphatic and aromatic hydrocarbons, catechol, ethylene glycol phenyl ether, and DDBSA.

Ink Removing Tests

Compositions A through E were tested for cleaning the following wafer probing inks manufactured by Markem Corporation: 7224 black, 7254 black, 8829 black, 8639 black, 4461 black, and series R with hysol (R-O-N black). Table 2 sets out the results of tests for these inks on Al/Cu/Si and Cu/Ag/Si substrates with compositions A through E.

TABLE 2

| Ink | Composition | Time/Temp | Remarks |
|---|---|---|---|
| 7224 black | A | 3–4 min/90° C. | 100% clean, no corrosion |
| 7254 black | B, C | 3 min/90° C. | 100% clean, no corrosion |
| 8829 black | A | 3–4 min/90° C. | 100% clean, no corrosion |
| 8639 black | B, C | 3 min/95° C. | 100% clean, no corrosion |
| 4461 black | A, B, C | 3–4 min/95° C. | 100% clean, no corrosion |
| R-O-N black | A, B, C | 3–4 min/95° C. | 100% clean, no corrosion |
| 7224, 8829, 8639 & R-O-N | D | 45–60 min/95° C. | some ink residue, severe corrosion |
| 7224, 8829 8639, & R-O-N | E | 45–55 min/95° C. | 99% clean, slight residue and corrosion |

Corrosion Tests

The corrosion resulting from different compositions of the present invention on various metal substrates was studied. In each test, a single wafer with Al/Cu/Si substrate on bonding pad areas of approximate dimensions 20 microns by 20 microns was immersed in the solution at 85° C. The wafers were then rinsed with isopropyl alcohol, washed with deionized water, and nitrogen blow dried. The examples were then examined for metal corrosion using a JOEL 6320 FESEM scanning electron microscope. With composition A, in a 2½ hour exposure, there was no corrosion. With composition B, after 1 hour, slight corrosion was seen with clean bonding pads and very minor corrosion spots on the bonding pads. With composition C there was no corrosion after 2 hours.

Similar corrosion experiments were conducted with 50% anisole, 25% DDBSA and 25% aliphatic hydrocarbon. The results were better than the results for compositions A through C, implying that the presence of anisole improved the performance of the stripper. Minor corrosion on Al/Si/Cu bonding pad areas was seen after 24 hours of immersion.

Similar tests were conducted using 75% anisole and 25% DDBSA. These results were the best and no corrosion was seen.

Negative Photoresist Stripping Test

The results given below show stripping of hard baked negative photoresist from metalized wafers. The photoresists used were SC series manufactured by JSR Japan Synthetic Rubber Company, and the products were SC-100, SC-180, and SC-450. Wafers were coated with negative resist, soft baked at 145° C. for 30 minutes and hard baked at 150° C. for 90 minutes. The wafers were developed with xylene, solvent VMP, or n-butyl acetate, and then tested as described below.

TABLE 3

| Resist | Composition | Process Time/Temp | Remarks |
|---|---|---|---|
| SC-100 | A | 2–3 min/85° C. | 100% clean |
| SC-100 | B | 3–4 min/85° C. | 100% clean |
| SC-100 | C | 4–5 min/85° C. | 100% clean |
| SC-180 | A | 5–10 min/85° C. | 100% clean |
| SC-180 | B | 12–15 min/90° C. | 99% clean (haze), cleaned with hot DI water as post strip rinse |
| SC-180 | C | 12–15 min/90° C. | 100% clean |
| SC-450 | A | 15–20 min/90° C. | 100% clean |
| SC-450 | B | 26–30 min/95° C. | 99% clean (haze), cleaned with hot DI water as post strip rinse |
| SC-450 | C | 30–35 min/90° C. | 99% clean (haze), cleaned with hot DI water as post strip rinse |

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method of stripping photoresist or probing ink from a substrate comprising contacting the substrate with a stripping solution for a period of time sufficient to remove the photoresist or probing ink from the substrate, said stripping solution consisting essentially of:

(a) from about 25% to about 75% by weight anisole;

(b) from about 15% to about 60% by weight of alkylarylsulfonic acids having from 12 to 20 carbons; and (c) from about 10% to about 40% by weight aliphatic hydrocarbons that have from 9 to 13 carbon atoms.

2. The method of claim 1, wherein the acid is dodecylbenzene sulfonic acid.

3. The method of claim 1, with the stripping solution consisting essentially of from about 25% to about 40% anisole, from about 20% to about 40% aliphatic hydrocarbons, and from about 20% to about 40% acids.

4. The method of claim 3, wherein the acid is dodecylbenzene sulfonic acid.

* * * * *